United States Patent
Lo et al.

(10) Patent No.: US 10,461,748 B2
(45) Date of Patent: Oct. 29, 2019

(54) ANTI-INTERFERENCE INTEGRATED CIRCUIT

(71) Applicant: AU OPTRONICS CORPORATION, Hsin-chu (TW)

(72) Inventors: Ting-Jung Lo, Hsin-chu (TW); Yueh-Han Li, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/816,297

(22) Filed: Nov. 17, 2017

(65) Prior Publication Data

US 2018/0167069 A1    Jun. 14, 2018

(30) Foreign Application Priority Data

Dec. 12, 2016    (TW) .............................. 105141085 A

(51) Int. Cl.
| | |
|---|---|
| *H03K 19/003* | (2006.01) |
| *H03K 5/24* | (2006.01) |
| *H03K 5/1252* | (2006.01) |
| *H02M 3/156* | (2006.01) |
| *H03K 5/13* | (2014.01) |
| *H03K 7/08* | (2006.01) |
| *H02M 1/00* | (2006.01) |

(52) U.S. Cl.
CPC ...... *H03K 19/00346* (2013.01); *H02M 3/156* (2013.01); *H03K 5/1252* (2013.01); *H03K 5/13* (2013.01); *H03K 5/24* (2013.01); *H03K 7/08* (2013.01); *H02M 2001/0038* (2013.01)

(58) Field of Classification Search
CPC .................. H03K 19/00346; H02M 3/156
See application file for complete search history.

(56) References Cited

U.S. PATENT DOCUMENTS 9,525,342 B2 * 12/2016 Li ..................... H02M 3/156
2014/0375288 A1   12/2014 Nora

FOREIGN PATENT DOCUMENTS

| CN | 104065261 A | 9/2014 |
| CN | 104617771 A | 5/2015 |
| CN | 105356734 A | 2/2016 |

OTHER PUBLICATIONS

Office Action issued by the State Intellectual Property Office of the Peoples Republic of China on Jul. 29, 2019 for Application No. CN201710043921.X.

* cited by examiner

*Primary Examiner* — Daniel C Puentes
(74) *Attorney, Agent, or Firm* — Tim Tingkang Xia, Esq.; Locke Lord LLP

(57) ABSTRACT

An anti-interference integrated circuit (IC) is adapted for avoiding an error in a frequency pulse caused by the interference of an adjacent IC. The anti-interference IC outputs a first time signal, and the adjacent IC outputs a second time signal. The anti-interference IC includes: a logic circuit, an adder, and a comparator. The logic circuit outputs a gate pulse according to a sequence of the second time signal. The adder adds the first time signal and the gate pulse. The comparator outputs the frequency pulse according to a signal adding result, where the period of the frequency pulse is the same as the period of the first time signal.

7 Claims, 6 Drawing Sheets

ANTI-INTERFERENCE INTEGRATED CIRCUIT

CROSS-REFERENCE TO RELATED PATENT APPLICATION

This application claims priority to and the benefit of, pursuant to 35 U.S.C. § 119(a), patent application Ser. No. 105141085 filed in Taiwan on Dec. 12, 2016. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an anti-interference integrated circuit (IC).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In the prior art, a buck IC sets an output voltage by using a feedback resistor. When a feedback voltage is less than a reference voltage, a constant-on-time (COT) control circuit outputs a gate pulse, so that setting of the output voltage can be implemented. The feedback voltage pulls back a comparator inside the IC, and is compared with a reference voltage inside the IC. When the feedback voltage is less than the reference voltage, the gate pulse generates a group of signals and provides the group of signals to a power stage for a voltage boost, so as to achieve an effect of voltage balance. A biggest advantage of such a voltage feedback control manner is that when an output current is rapidly switched between light load and heavy load, a switching frequency of a switch of the IC is changed, so as to achieve an effect of low ripples. However, when two COT buck ICs are excessively close in the layout and wiring, a feedback voltage of one COT buck IC may be interfered with when the other COT buck IC outputs a gate pulse, causing the feedback voltage to be less than a reference voltage to lead to an error, resulting in that ripples of an output voltage become large.

SUMMARY

The present invention provides an anti-interference IC, so as to avoid mutual interference between adjacent COT buck ICs that causes an error in a frequency pulse. In the anti-interference IC provided in the present invention, a pin is added to detect whether a gate pulse of another COT buck IC is in a high-potential state. When the gate pulse of the another COT buck IC is at a high potential, a metal-oxide-semiconductor field-effect transistor is turned on inside the anti-interference IC, to pull up a feedback voltage of a power stage, so as to make the feedback voltage of the power stage be not less than a reference voltage, thereby avoiding an erroneous pulse output.

An embodiment of the present invention provides an anti-interference IC, adapted for avoiding an error in a frequency pulse caused by the interference of an adjacent IC. The anti-interference IC outputs a first time signal, and the adjacent IC outputs a second time signal. The anti-interference IC comprises: a logic circuit, an adder, and a comparator. The logic circuit receives the second time signal, and outputs a gate pulse according to a sequence of the second time signal. The adder is connected to the logic circuit, and adds a first signal and the gate pulse. The comparator is connected to the adder. The comparator outputs the frequency pulse according to a signal adding result of the adder, wherein the period of the frequency pulse is the same as the period of the first time signal.

In some embodiments, the first signal is the first time signal, the adder adds the first time signal and the gate pulse to output an added signal, the comparator compares a reference signal with the added signal, and when the reference signal has a voltage value greater than or equal to that of the added signal, the comparator outputs the frequency pulse.

In some embodiments, the anti-interference IC further comprises a COT control circuit, and the COT control circuit outputs a first original time signal according to the period of the frequency pulse, wherein the first original time signal is a digital signal, and is a time signal originally generated when the anti-interference IC is not interfered with by the adjacent IC.

In some embodiments, the anti-interference IC further comprises: a power stage circuit and a first resistor. The power stage circuit is connected to the COT control circuit, and receives the first original time signal. The first resistor is connected to the power stage circuit, and performs waveform conversion of the power stage circuit and the first resistor on the first original time signal, to output the first time signal, wherein the first time signal is a triangular wave signal.

In some embodiments, the anti-interference IC further comprises: a reference voltage generator. The reference voltage generator is connected to the comparator, and generates the reference signal. The reference voltage generator may be a power supply.

In some embodiments, the first signal is a reference signal, the adder adds the reference signal and the gate pulse to output the added signal, the comparator compares the first time signal with the added signal, and when a voltage value of the added signal is greater than or equal to a voltage value of the first time signal, the comparator outputs the frequency pulse.

In some embodiments, the reference voltage generator in the anti-interference IC is connected to the comparator through the adder. The reference voltage generator generates the reference signal. The reference voltage generator may be a power supply.

An embodiment of the present invention provides an anti-interference IC, adapted for avoiding an error in a frequency pulse caused by the interference of an adjacent IC. The anti-interference IC outputs a first time signal, and the adjacent IC outputs a second time signal. The anti-interference IC comprises: a logic circuit, a comparator, and a logic controller. The logic circuit receives the second time signal, and outputs a gate pulse according to a sequence of the second time signal. The comparator is configured to compare a reference signal with the first time signal, and when the reference signal has a voltage value greater than or equal to a voltage value of the first time signal, output a specific frequency pulse. The logic controller receives the gate pulse and the specific frequency pulse, and performs an Exclusive OR operation on the gate pulse and the specific frequency pulse, wherein an operation result is the frequency pulse, and the period of the frequency pulse is the same as the period of the first time signal.

In some embodiments, the anti-interference IC further comprises a COT control circuit. The COT control circuit outputs a first original time signal according to the period of the frequency pulse, wherein the first original time signal is a digital signal, and is a time signal originally generated when the anti-interference IC is not interfered with by the adjacent IC.

In some embodiments, the anti-interference IC further comprises a power stage circuit and a first resistor. The power stage circuit is connected to the COT control circuit, and receives the first original time signal. The first resistor is connected to the power stage circuit, and performs waveform conversion of the power stage circuit and the first resistor on the first original time signal, to output the first time signal, wherein the first time signal is a triangular wave signal.

In some embodiments, the anti-interference IC further comprises a reference voltage generator. The reference voltage generator is connected to the comparator, and generates the reference signal. The reference voltage generator may be a power supply.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

A plurality of the embodiments of the present invention is disclosed below with reference to the accompanying drawings. For clear description, many details in practice will be described together in the following description. However, it should be understood that these details in practice should not be used to limit the present invention. That is, in some embodiments of the present invention, these details in practice are not essential. In addition, to simplify the accompanying drawings, some conventional structures and elements are shown in a simple schematic manner in the accompanying drawings.

The terms "comprise", "include", "have" and "contain" as used herein are all open terms, that is, mean "including, but not limited to".

The term "and/or" as used herein includes any or all combinations of the objects described.

Unless otherwise specified, all the terms as used herein generally have the same meaning as is commonly understood by persons skilled in the art. Some terms used for describing the disclosure will be discussed below or in other parts of this specification, so as to provide additional guidance for persons skilled in the art in addition to the description of the disclosure.

Figure 1A:
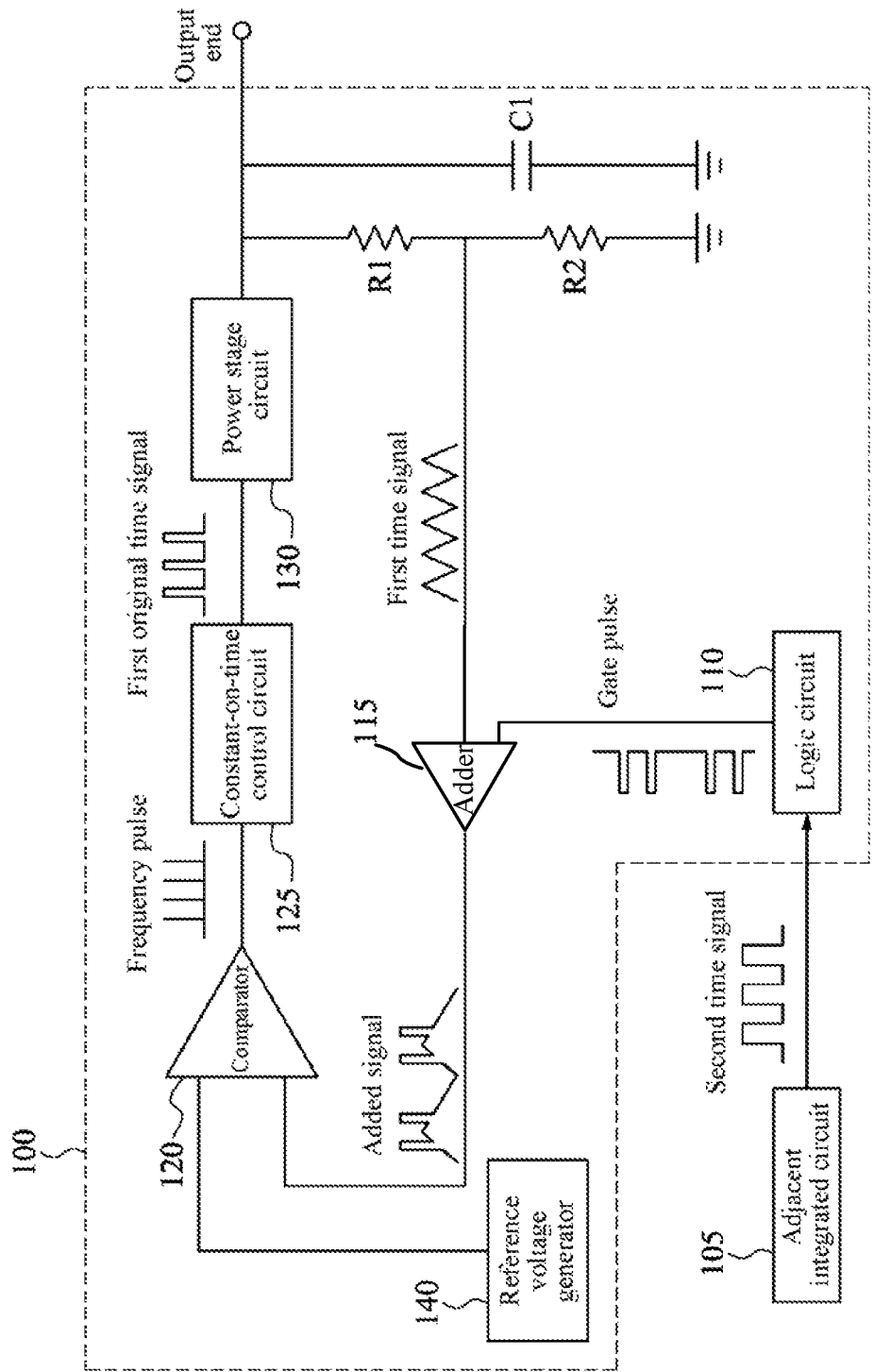
FIG. 1A is a functional block diagram of an anti-interference IC according to a first embodiment of the present invention.
Figure 1B:
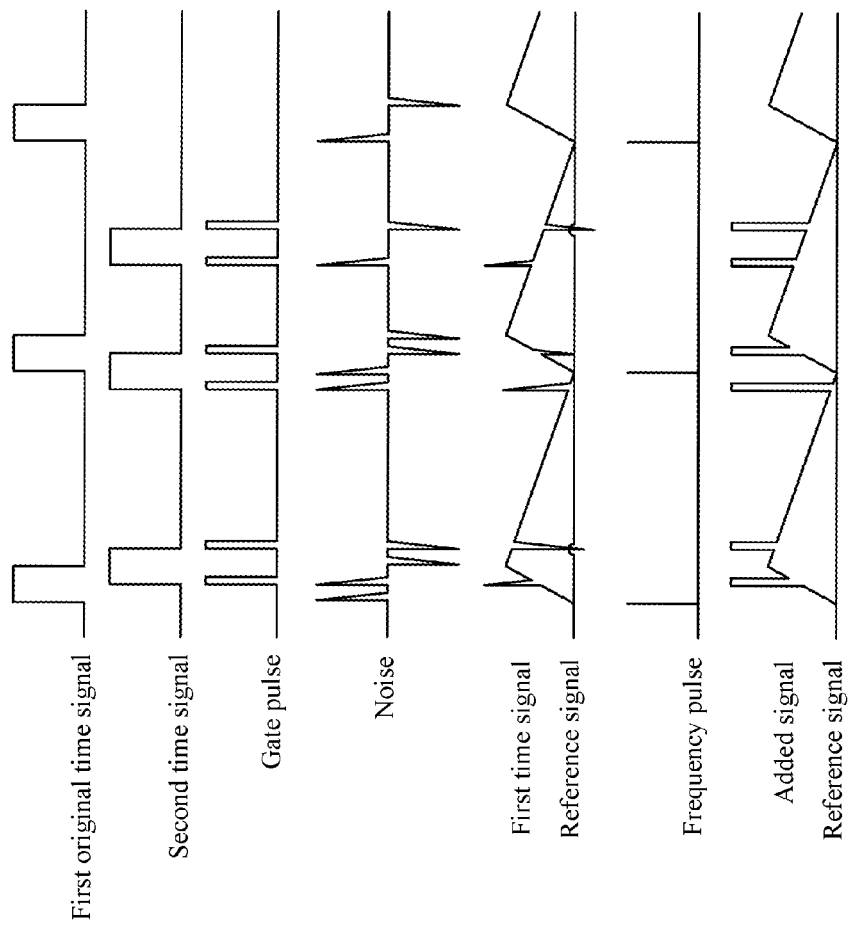
FIG. 1B is a schematic signal waveform diagram of the anti-interference IC according to the first embodiment of the present invention.

FIG. 1A is a functional block diagram of an anti-interference IC according to a first embodiment of the present invention. FIG. 1B is a schematic signal waveform diagram of the anti-interference IC according to the first embodiment of the present invention. The first embodiment of the present invention provides an anti-interference IC 100, adapted for avoiding an error in a frequency pulse caused by the interference of an adjacent IC 105. The anti-interference IC 100 outputs a first time signal, and the adjacent IC 105 outputs a second time signal. The anti-interference IC 100 includes: a logic circuit 110, an adder 115, a comparator 120, a COT control circuit 125, a power stage circuit 130, a reference voltage generator 140, a first resistor R1, a second resistor R2, and a capacitor C1.

In the first embodiment of the present invention, the logic circuit 110 receives the second time signal related to the adjacent IC 105, and outputs a gate pulse according to a sequence of the second time signal. The reference voltage generator 140 generates a reference signal. The reference voltage generator may be a power supply, and is connected to the comparator 120 in the present invention. The COT control circuit 125 outputs a first original time signal according to the period of the frequency pulse. The first original time signal is a digital signal, and is a time signal originally generated when the anti-interference IC 100 is not interfered with by the adjacent IC 105. The power stage circuit 130 is connected to the COT control circuit 125, and receives the first original time signal. The first resistor R1 is connected to the power stage circuit 130, and performs waveform conversion of the power stage circuit 130 and the first resistor R1 on the first original time signal, to output the first time signal, where the first time signal is a triangular wave signal.

The adder 115 is connected to the logic circuit 110. The adder 115 receives the gate pulse, and adds a first signal and the gate pulse, to output an added signal. The comparator 120 is connected to the adder 115. The comparator 120 outputs the frequency pulse according to a signal adding result of the adder 115. The period of the frequency pulse is the same as the period of the first time signal. In the first embodiment of the present invention, the first signal is the first time signal. The adder 115 adds the first time signal and the gate pulse, to output an added signal. The comparator 120 compares a reference signal with the added signal. When the reference signal has a voltage value greater than or equal to that of the added signal, the comparator 120 outputs the frequency pulse, as shown in FIG. 1B.

The adjacent IC 105 interferes with the anti-interference IC 100 itself. Therefore, in an anti-interference embodiment provided in the present invention, the second time signal generated by the adjacent IC 105 is processed by using the logic circuit 110 to generate the gate pulse. By means of the gate pulse, a potential change of a sequence signal of the adjacent IC 105 is obtained. When the second time signal is at a high potential, for the anti-interference IC 100, noise is easily generated to interfere with the first time signal. Therefore, the logic circuit 110 converts the second time signal into the gate pulse, and the adder 115 is then used to add the first time signal and the gate pulse. By means of an added signal generated by using an addition effect of the adder 115, high potentials of the gate pulse at a part of sequences are used, so that high potentials of the first time signal at the part of sequences are improved. The part of sequences is a part that may be interfered with by the second time signal.

In other words, before interference, potentials at sequences that are highly susceptible to interference are first improved. The first time signal and the gate pulse are added to form an added signal, so that the added signal still has a potential higher than that of the reference signal at the sequences that are highly susceptible to interference. The reason is that in a circuit design of the present invention, when the reference signal has a voltage value greater than or equal to that of the added signal, the anti-interference IC 100 normally outputs the frequency pulse. The foregoing addition mechanism avoids that a potential of the first time signal is less than that of the reference signal outside an inherent sequence (a sequence on which the frequency pulse is normally output) because of noise interference, and therefore, in a non-inherent sequence, the frequency pulse is abnormally output.

Figure 2A:
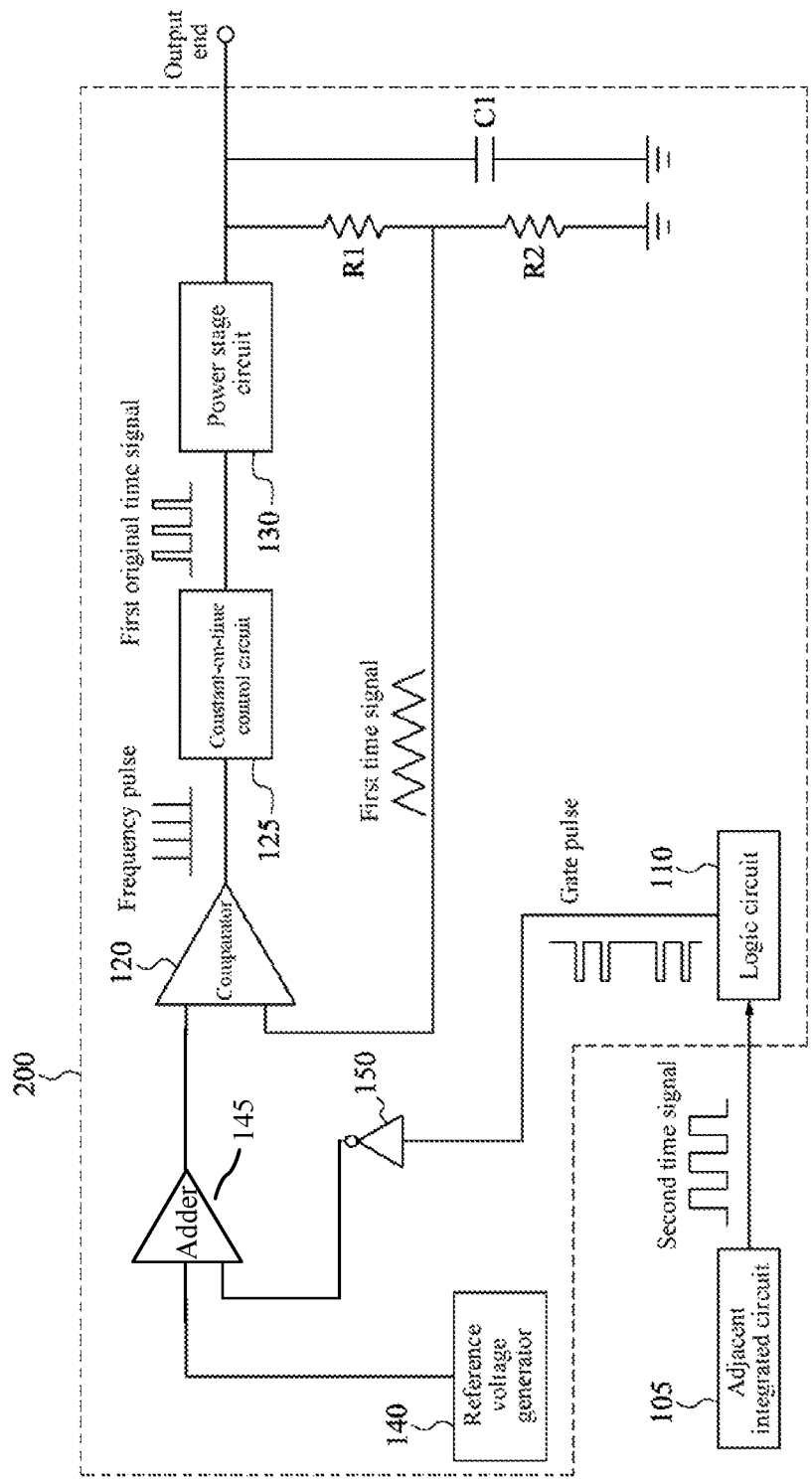
FIG. 2A is a functional block diagram of an anti-interference IC according to a second embodiment of the present invention.
Figure 2B:
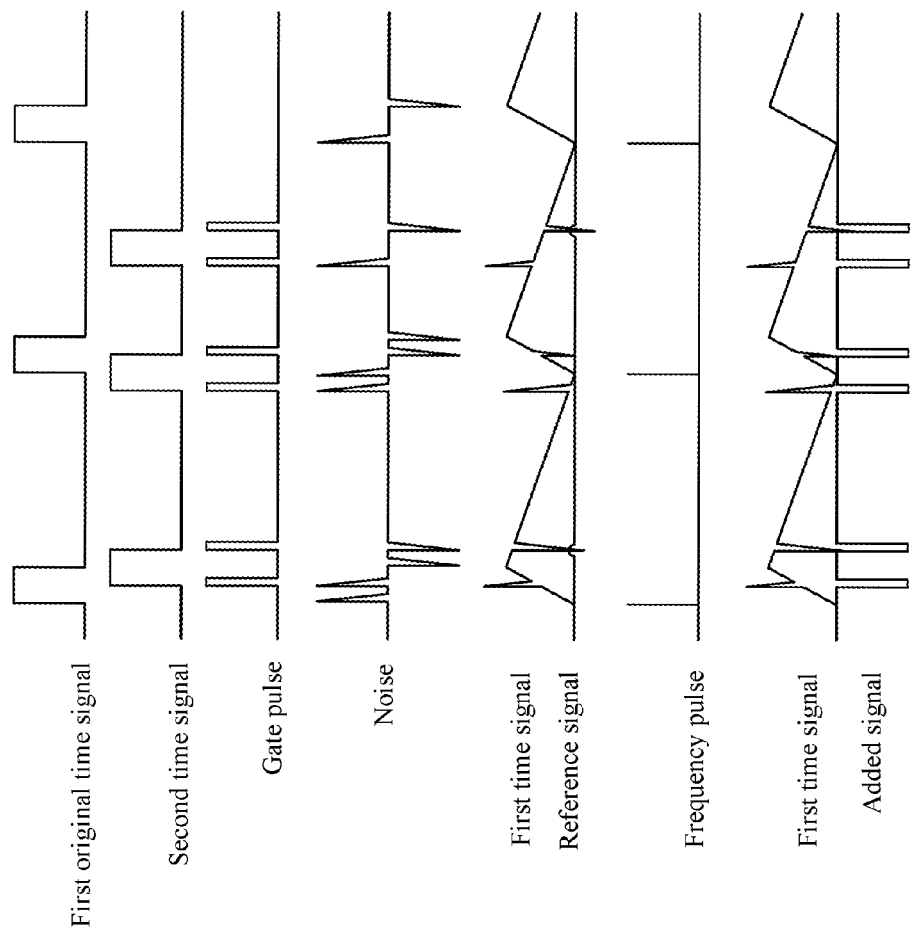
FIG. 2B a schematic signal waveform diagram of the anti-interference IC according to the second embodiment of the present invention.

FIG. 2A is a functional block diagram of an anti-interference IC according to a second embodiment of the present invention. FIG. 2B is a schematic signal waveform diagram of the anti-interference IC according to the second embodiment of the present invention. The second embodiment is different from the first embodiment of the present invention in terms of a combination manner of circuit members. The second embodiment of the present invention provides another anti-interference IC 200, so as to avoid an error in a frequency pulse caused by the interference of an adjacent IC 105. The anti-interference IC 200 outputs a first time signal, and the adjacent IC 105 outputs a second time signal. The anti-interference IC 200 includes: a logic circuit 110, a comparator 120, a COT control circuit 125, a power stage circuit 130, a reference voltage generator 140, an adder 145, an inverter 150, a first resistor R1, a second resistor R2, and a capacitor C1.

In the second embodiment of the present invention, the logic circuit 110 receives the second time signal related to the adjacent IC 105, and outputs a gate pulse according to a sequence of the second time signal. In the second embodiment, the reference voltage generator 140 is connected to the comparator 120 through the adder 145. The reference voltage generator 140 generates a reference signal, and may be a power supply. The COT control circuit 125 outputs a first original time signal according to the period of the frequency pulse. The first original time signal is a digital signal, and is a time signal originally generated when the anti-interference IC 200 is not interfered with by the adjacent IC 105. The power stage circuit 130 is connected to the COT control circuit 125, and receives the first original time signal. The first resistor R1 is connected to the power stage circuit 130, and performs waveform conversion of the power stage circuit 130 and the first resistor R1 on the first original time signal, to output the first time signal, where the first time signal is a triangular wave signal.

The adder 145 is connected to the logic circuit 110. The adder 145 receives the gate pulse on which the inverter 150 has performed phase inversion. The adder 145 adds a first signal and the gate pulse obtained after phase inversion, to output an added signal. The comparator 120 is connected to the adder 145. The comparator 120 outputs the frequency pulse according to a signal adding result of the adder 145, where the period of the frequency pulse is the same as the period of the first time signal. In the second embodiment of the present invention, the first signal is the reference signal. The adder 145 adds the reference signal and the gate pulse that is obtained after phase inversion, to output an added signal. The comparator 120 compares the first time signal with the added signal. When a voltage value of the added signal is greater than or equal to a voltage value of the first time signal, the comparator 120 outputs the frequency pulse, as shown in FIG. 2B.

The adjacent IC 105 interferes with the anti-interference IC 200 itself. Therefore, in a second anti-interference embodiment of the present invention, the second time signal generated by the adjacent IC 105 is processed by using the logic circuit 110 to generate the gate pulse. By means of the gate pulse, a potential change of a sequence signal of the adjacent IC 105 is obtained. When the second time signal is at a high potential, for the anti-interference IC 200, noise is easily generated to interfere with the first time signal. Therefore, in the second embodiment, the logic circuit 110 converts the second time signal into the gate pulse, and the adder 145 is used to add the reference signal and the gate pulse that is obtained after phase inversion, to output an added signal. By means of the added signal generated by using an addition effect of the adder 145, phase inversion of high potentials of the gate pulse at a part of sequences is used to pull down potentials of the reference signal at the part of sequences. The part of sequences is a part that may be interfered with by the second time signal.

In other words, before interference, potentials of the reference signal at the sequences that are highly susceptible to interference are first lowered. The reference signal and the gate pulse that is obtained after phase inversion are added to form an added signal, so that potentials of the added signal at the sequences that are highly susceptible to interference can be less than that of the first time signal. The reason is that in a circuit design of the second embodiment of the present invention, when the added signal has a voltage value greater than or equal to that of the first time signal, the anti-interference IC 200 normally outputs the frequency pulse. The foregoing addition mechanism avoids that a potential of the first time signal is less than that of the reference signal outside an inherent sequence (a sequence on which the frequency pulse is normally output) because of noise interference, and therefore, in a non-inherent sequence, the frequency pulse is abnormally output.

Figure 3A:
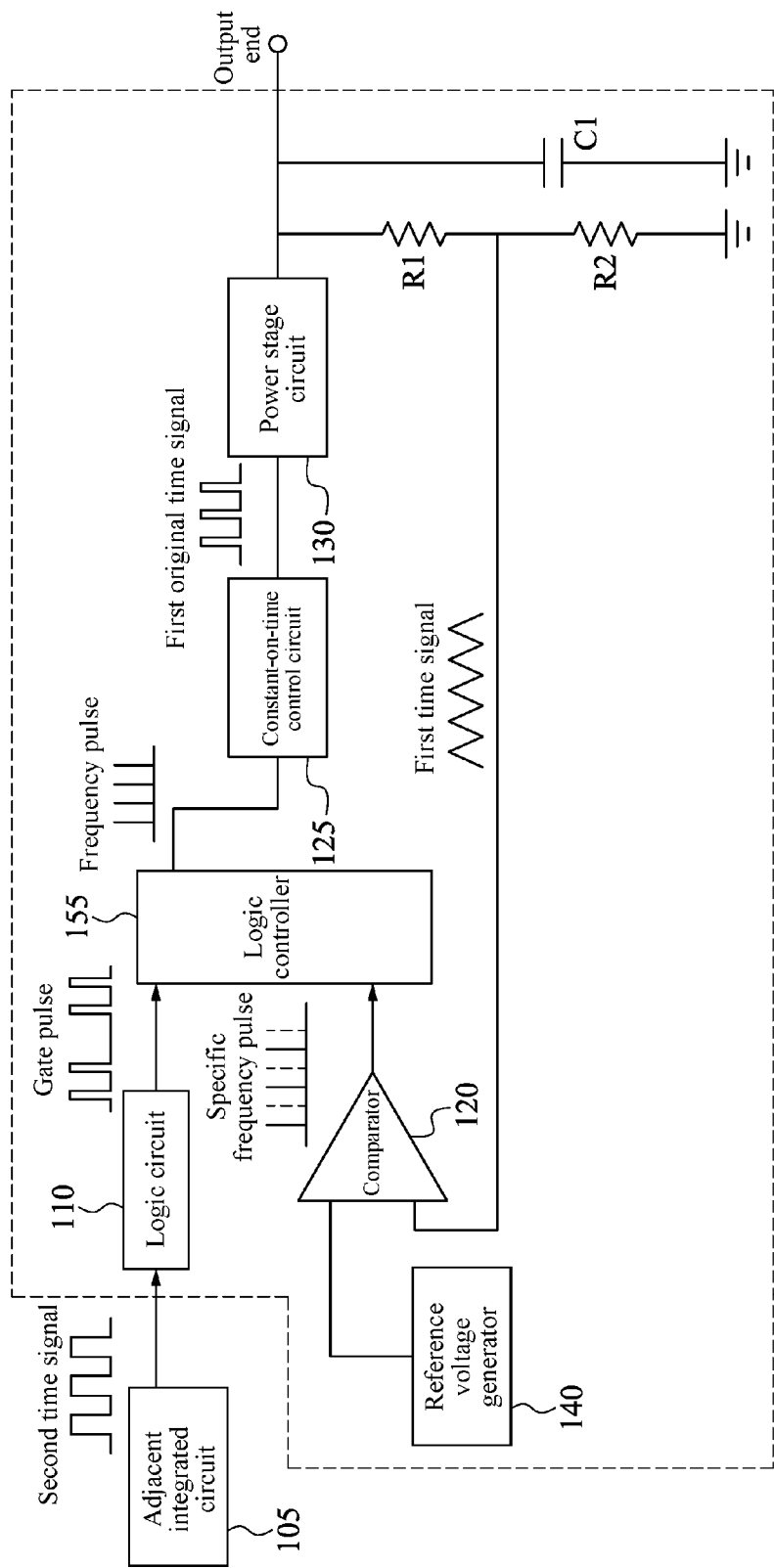
FIG. 3A is a functional block diagram of an anti-interference IC according to a third embodiment of the present invention.
Figure 3B:
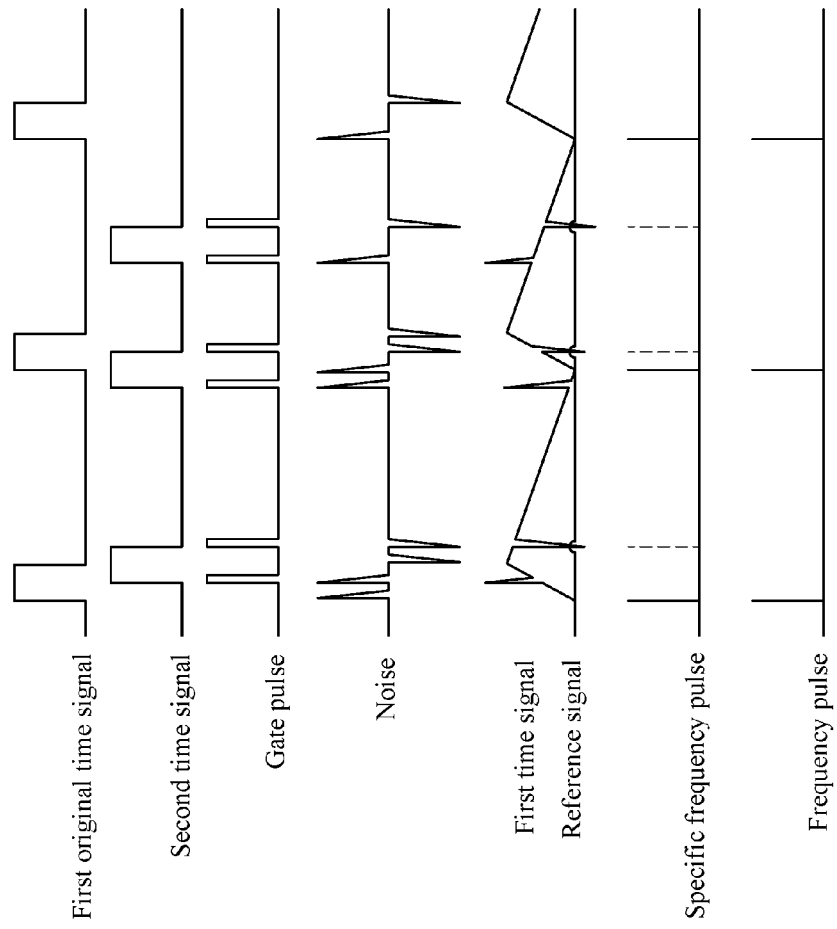
FIG. 3B a schematic signal waveform diagram of the anti-interference IC according to the third embodiment of the present invention.

FIG. 3A is a functional block diagram of an anti-interference IC according to a third embodiment of the present invention. FIG. 3B is a schematic signal waveform diagram of the anti-interference IC according to the third embodiment of the present invention. The third embodiment is different from the first and second embodiments of the present invention in terms of a combination manner of circuit members. The third embodiment of the present invention provides another anti-interference IC 300, so as to avoid an error in a frequency pulse caused by the interference of an adjacent IC 105. The anti-interference IC 300 outputs a first time signal, and the adjacent IC 105 outputs a second time signal. The anti-interference IC 300 includes: a logic circuit 110, a comparator 120, a COT control circuit 125, a power stage circuit 130, a reference voltage generator 140, a logic controller 155, a first resistor R1, a second resistor R2, and a capacitor C1.

In the third embodiment of the present invention, the logic circuit 110 receives the second time signal related to the adjacent IC 105, and outputs a gate pulse according to a sequence of the second time signal. In the third embodiment, the reference voltage generator 140 is connected to the comparator 120. The reference voltage generator 140 generates a reference signal, and may be a power supply. The COT control circuit 125 outputs a first original time signal according to the period of the frequency pulse. The first original time signal is a digital signal, and is a time signal originally generated when the anti-interference IC 300 is not interfered with by the adjacent IC 105. The power stage circuit 130 is connected to the COT control circuit 125, and receives the first original time signal. The first resistor R1 is connected to the power stage circuit 130, and performs waveform conversion of the power stage circuit 130 and the first resistor R1 on the first original time signal, to output the first time signal, where the first time signal is a triangular wave signal.

In the third embodiment, the logic circuit 110 receives the second time signal, and outputs the gate pulse according to a sequence of the second time signal. The comparator 120 compares the reference signal with the first time signal, and when the reference signal has a voltage value greater than or equal to a voltage value of the first time signal, outputs a specific frequency pulse. The logic controller 155 receives the gate pulse and the specific frequency pulse, and performs an Exclusive OR operation on the gate pulse and the specific frequency pulse, where an operation result is the frequency pulse, and the period of the frequency pulse is the same as the period of the first time signal, as shown in FIG. 3B.

The adjacent IC 105 interferes with the anti-interference IC 300 itself. Therefore, in the second anti-interference embodiment of the present invention, the second time signal generated by the adjacent IC 105 is processed by using the logic circuit 110 to generate the gate pulse. By means of the gate pulse, a potential change of a sequence signal of the adjacent IC 105 is obtained. When the second time signal is at a high potential, for the anti-interference IC 300, noise is easily generated to interfere with the first time signal. As shown in FIG. 3B, because of noise interference, when the reference signal has a voltage value greater than or equal to that of the first time signal, a specific frequency pulse is output. The specific frequency pulse has a part that is an abnormal output (for example, at a dotted line). This abnormality is a result of the interference from the second time signal. Therefore, in the present invention, the logic controller 155 is used to perform an Exclusive OR operation on the gate pulse and the specific frequency pulse. When the gate pulse and the specific frequency pulse are both at high potentials, this pulse is ignored, because this pulse may be caused by interference. After this Exclusive OR operation is performed, the output is an output of the frequency pulse in normal operation, and the period of the frequency pulse is the same as the period of the first time signal.

The present invention provides an anti-interference IC, so as to avoid mutual interference between adjacent COT buck ICs that causes an error in a frequency pulse. In the anti-interference IC provided in the present invention, a pin is added to detect whether a gate pulse of another COT buck IC is in a high-potential state. When the gate pulse of the another COT buck IC is at a high potential, a metal-oxide-semiconductor field-effect transistor is turned on inside the anti-interference IC, to pull up a feedback voltage of a power stage, so as to make the feedback voltage of the power stage be not less than a reference voltage, thereby avoiding an erroneous pulse output.

Although the present invention is disclosed as above by using multiple embodiments, these embodiments are not used to limit the present invention. Any person skilled in the art may make various changes and modifications without departing from the spirit and scope of the present invention, and therefore the protection scope of the present invention should be as defined by the appended claims.

What is claimed is:

1. An anti-interference integrated circuit (IC), adapted for avoiding an error in a frequency pulse caused by an interference of an adjacent IC, wherein the anti-interference IC outputs a first time signal, the adjacent IC outputs a second time signal, and the anti-interference IC comprises:
   a logic circuit, receiving the second time signal, and outputting a gate pulse according to a sequence of the second time signal;
   an adder, connected to the logic circuit, and adding a first signal and the gate pulse;
   a comparator, connected to the adder, and outputting the frequency pulse according to a signal adding result of the adder, wherein a period of the frequency pulse is the same as a period of the first time signal; and
   a constant-on-time (COT) control circuit, outputting a first original time signal according to the period of the frequency pulse, wherein the first original time signal is a digital signal, and is a time signal originally generated when the anti-interference IC is not interfered with by the adjacent IC;
   wherein the first signal is the first time signal, the adder adds the first time signal and the gate pulse to output an added signal, the comparator compares a reference signal with the added signal, and when the reference signal has a voltage value greater than or equal to that of the added signal, the comparator outputs the frequency pulse.

2. The anti-interference IC according to claim 1, further comprising:
   a power stage circuit, connected to the COT control circuit, and receiving the first original time signal; and
   a first resistor together with a second resistor and a first capacitor, connected to the power stage circuit, and performing waveform conversion of the power stage circuit and the first resistor on the first original time signal, to output the first time signal, wherein the first time signal is a triangular wave signal.

3. The anti-interference IC according to claim 1, further comprising:
   a reference voltage generator, connected to the comparator, and generating the reference signal, wherein the reference voltage generator is a power supply.

4. An anti-interference IC, adapted for avoiding an error in a frequency pulse caused by an interference of an adjacent IC, wherein the anti-interference IC outputs a first time signal, the adjacent IC outputs a second time signal, and the anti-interference IC comprises:
   a logic circuit, receiving the second time signal, and outputting a gate pulse according to a sequence of the second time signal;
   an adder, connected to the logic circuit, and adding a first signal and the gate pulse; and a comparator, connected to the adder, and outputting the frequency pulse according to a signal adding result of the adder, wherein a period of the frequency pulse is the same as a period of the first time signal;

wherein the first signal is a reference signal, the adder adds the reference signal and the gate pulse to output the added signal, the comparator compares the first time signal with the added signal, and when a voltage value of the added signal is greater than or equal to a voltage value of the first time signal, the comparator outputs the frequency pulse.

5. The anti-interference IC according to claim 4, further comprising:

a constant-on-time (COT) control circuit, outputting a first original time signal according to the period of the frequency pulse, wherein the first original time signal is a digital signal, and is a time signal originally generated when the anti-interference IC is not interfered with by the adjacent IC.

6. The anti-interference IC according to claim 5, further comprising:

a power stage circuit, connected to the COT control circuit, and receiving the first original time signal; and a first resistor together with a second resistor and a first capacitor, connected to the power stage circuit, and performing waveform conversion of the power stage circuit and the first resistor on the first original time signal, to output the first time signal, wherein the first time signal is a triangular wave signal.

7. The anti-interference IC according to claim 4, further comprising:

a reference voltage generator, connected to the comparator through the adder, and generating the reference signal, wherein the reference voltage generator is a power supply.

* * * * *